United States Patent [19]

Ausschnitt et al.

[11] Patent Number: 4,890,239
[45] Date of Patent: Dec. 26, 1989

[54] LITHOGRAPHIC PROCESS ANALYSIS AND CONTROL SYSTEM

[75] Inventors: Christopher P. Ausschnitt, Cambridge; Edward A. McFadden, Midford, both of Mass.; Raul V. Tan, San Jose, Calif.

[73] Assignee: Shipley Company, Inc., Newton, Mass.

[21] Appl. No.: 110,905

[22] Filed: Oct. 20, 1987

[51] Int. Cl.⁴ .................... G06F 15/46; G21K 5/04; H01J 37/302

[52] U.S. Cl. ................. 364/491; 250/396 R; 250/492.2

[58] Field of Search ............ 364/490, 491, 571, 578; 250/396 R, 398, 491.1, 491.2

[56] References Cited

U.S. PATENT DOCUMENTS

| | | |
|---|---|---|
| 4,393,312 | 7/1983 | Collier et al. ............ 250/492.2 |
| 4,430,571 | 2/1984 | Smith et al. ............ 250/492.2 |
| 4,694,178 | 9/1987 | Harte ............ 250/396 R |
| 4,698,509 | 10/1987 | Wells et al. ............ 250/492.2 |
| 4,718,019 | 1/1988 | Fillion et al. ............ 364/491 |
| 4,777,369 | 10/1988 | Nakamura et al. ............ 250/398 |
| 4,785,189 | 11/1988 | Wells ............ 250/492.2 |
| 4,812,661 | 3/1989 | Owen ............ 250/492.1 |

Primary Examiner—Felix D. Gruber
Attorney, Agent, or Firm—Robert M. Asher; Robert L. Goldberg

[57] ABSTRACT

A lithographic process analysis and control system which provides a modeled version of a lithographic process in the dimensions of feature width, focus and exposure. This system uses the model to quickly determine the range of focus and exposure limits for obtaining the desired feature width. The system has flexible graphic display capability for displaying graphic representations of the data as measured and modeled.

12 Claims, 9 Drawing Sheets

LITHOGRAPHIC PROCESS ANALYSIS AND CONTROL SYSTEM

BACKGROUND OF THE INVENTION

The present invention is directed to a computer system for modeling the parameters of a lithographic process and flexibly providing graphic displays useful in optimizing the lithographic process. In particular, the present invention is directed to a system that determines the optimum range of exposure and focus settings for reliably manufacturing integrated circuits within desired feature width tolerances.

Lithography is the process used for patterning semiconductor wafers in the manufacture of integrated circuits. Lithographic performance is determined by the measurement and control of two key parameters: critical dimension (CD)—the size of critical features on the pattern, typically line width—and pattern registration (PR)—the relative placement of pattern features with respect to one another. As feature sizes shrink and integrated circuit complexity increase there is a growing need for improved methods to analyze the CD and PR data in order to optimize and control the manufacturing process.

Variations that may occur in the lithographic process may be divided into spatial (different patterns printed at different locations at approximately the same time) and temporal (the same pattern at the same location printed at different times distributions. The appropriate time scale is determined by the frequency of variation in the process. In the extremes, a perfectly stable process is characterized entirely by the spatial distribution, whereas a wildly unstable process is characterized by the temporal distribution. More typical of existing lithographic capability is that both distributions must be considered. For a reasonably stable process, a batch of wafers patterned during a single shift exhibits mostly spatial variation, whereas temporal variations occur over several shifts.

The spatial and temporal variations have controllable components that may be traced to adjustments in lithographical parameters and uncontrollable components. It is an object of the present invention to provide an analysis of variations so as to improve the manufacturing process by permitting optimization of controllable parameters on the manufacturing equipment. By optimizing the manufacturing parameters such a the choice of exposure time, film thickness, bake temperature, development rate, etc., present equipment can operate closer to the target operating point and reduce spatial and temporal variation. Since new improved equipment is not required, parameter design is the least expensive approach to improving the manufacturing process.

Systems are available which can receive raw data from metrology and lithographic tools. However, methods have not been available for using the data for determining the optimum range of exposure and focus settings for producing integrated circuits within desired feature width limits. It is an object of the present invention to provide a system that can flexibly display graphs of the relationship between focus, exposure and feature width to improve the usefulness of the data. It is a further object of the present invention to provide a model of the critical dimension data thereby reducing that data to equations which can be quickly and efficiently analyzed and interpreted by a computer. It is a still further object of the present invention to provide rapid analysis of the critical dimension data so as to permit real time control of the lithographic process.

SUMMARY OF THE INVENTION

The present invention is directed to a computer system for analyzing lithographic processes having an interface for receiving focus exposure and feature width data from metrology or lithographic tools, memory for storing the data in a form that may be useful in analysis, a program for best fitting the data to a critical dimension model and a display for showing a graphical representation of the best fit model. The lithographic process analysis system further includes a program for computing from the modeled data parameter limits for use by the lithographic tools in optimizing the manufacturing process. The system further includes a program for permitting graphical display in three dimensions. This system further features the ability to select a program that permits two graphs to be displayed at the same time on the left and right side of the display screen and/or overlays of two or more graphs on each side. A program is also provided which permits interpolation of the data so that two graphs may be compared along the same parameter values.

Other objects and advantages of the present invention will become apparent during the following description of the presently preferred embodiment of the invention taken in conjunction with the drawings.

DETAILED DESCRIPTION OF THE PREFERRED EMBODIMENT

Figure 1:
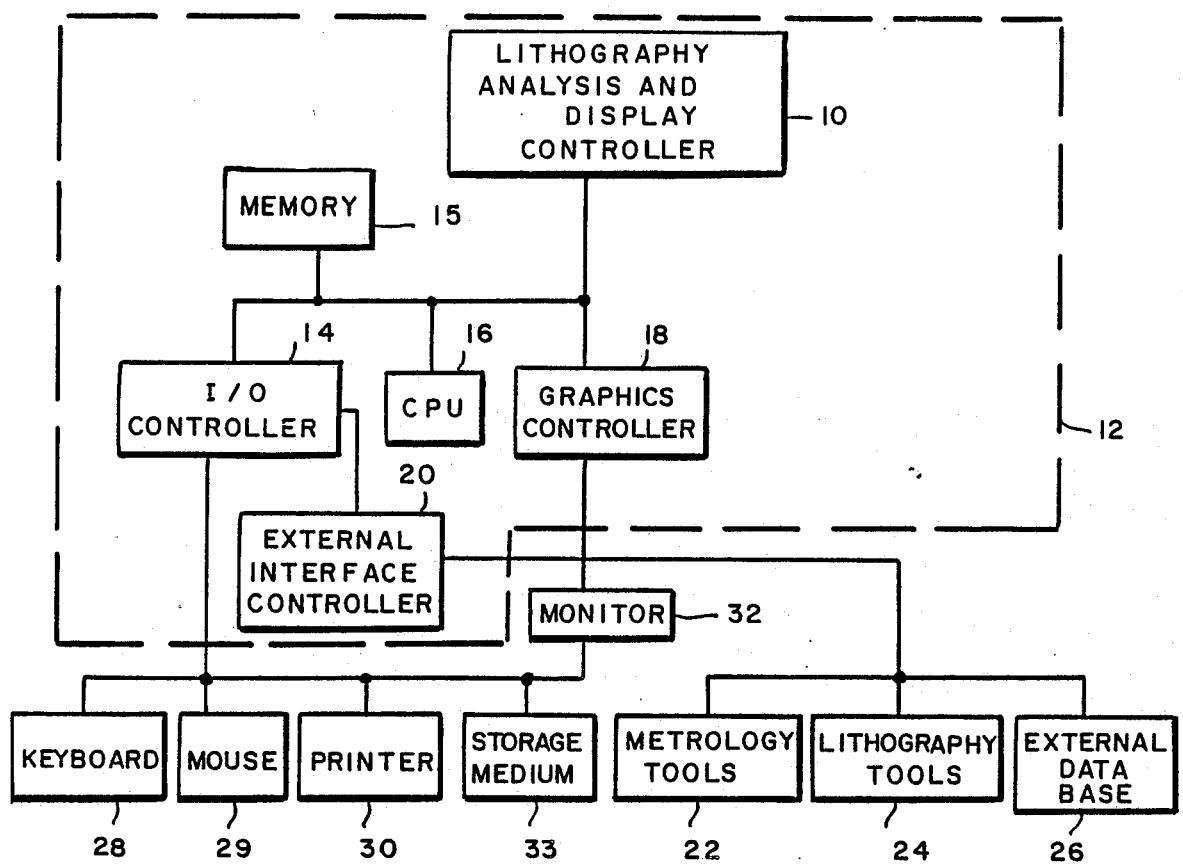
FIG. 1 is a schematic representation of the overall system of the present invention.

The lithography process analysis and display controller 10 of the present invention is provided in a computer or data processor 12. The computer 12 includes standard elements such as an input/output controller 14, memory 15, a CPU 16, a graphics display controller 18 and an external interface controller 20. The graphics display controller 18 may be a Verticom M16E. The CPU may be an Intel 80286. The memory 15 can be used to store data accumulated and generated by the computer system. The interface 20 may be a conventional interface such as an RS232 port interface. The interface 20 is provided for receiving data from either a metrology tool 22, a lithography tool 24 or an external data base 26. The external data base 26 may be located in an independent computer. The external data base 26 could store results from previously conducted experiments. The lithography tools 24 may be any of those commonly used in the art such as optical tools, electron beam tools or X-ray tools. Lithography tools 24 are known which provide measurements that can be provided to an interface 20 and analyzed by the system of the present invention. Metrology tools 22 are commonly known in the lithography art and include optical probe systems, scanning electron microscopes and electrical probe systems. These tools are used to measure feature size on integrated circuits during the lithography process.

The IO controller 14 of the computer 12 interfaces with a keyboard 28, a printer 30, a monitor 32 and a storage medium 33. The monitor 32 is preferably a color monitor for ease of viewing especially when viewing two graphs which overlay one another. The storage medium is a memory device such as a hard disk or tape drive. In addition to a keyboard 28, it is advantageous to provide a mouse 29 for ease of controlling the screens which appear on the monitor 32 when operating the present system.

Figure 2:
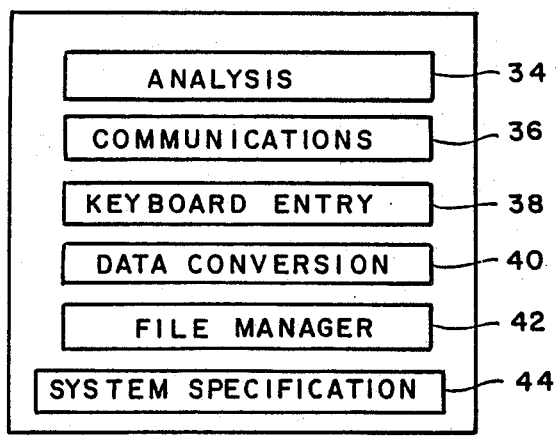
FIG. 2 is a front view of the monitor screen displaying the highest level menu of the system of the present invention.

Referring now to FIG. 2, the screen which appears upon entering the system of the present invention is displayed. On the screen shown, the sub-programs of the lithography analysis and display controller 10 are listed. A user may select any one of these sub-programs by using the mouse 29 for instance to move the cursor to the desired sub-program name. As shown in FIG. 2 the sub-program communications is highlighted by the cursor. Movement of the mouse would move the cursor from one program to another and pressing the activation button on the mouse makes the selection of that program which is highlighted by the cursor at that time.

The sub-programs of the lithography analysis and display controller include analysis 34, communications 36, keyboard entry 38, data conversion 40, file manager 42 and system specification 44. The communications program 36 provides a library of programs each designed to effect communications between the computer 12 and one of the metrology tools 22 or lithography tools 24. For each tool there is a separate communications routine which will allow the computer to receive data as it is provided through the interface 20 into the computer and to transmit control signals from the computer to the tool. Such communication routines are well within the skill of those in the art and their design depends upon the data format and output interface routines being followed by any particular metrology or lithography tool.

The keyboard entry 38 sub-program provides for manual entering of a data base into the computer 12.

The data conversion sub-program 40 is used for adding parameters not provided over the communication link with a tool. Such parameters as exposure and focus settings describe the experiment being run and often need to be separately entered. The data conversion sub-program also serves to put the experiment data into a format that can be used by the analysis sub-program.

The file manager program 42 is a typical flat file data base management program.

The system specification sub-program 44 permits entry of defining characteristics of tools and materials used in the lithography process.

The analysis sub-program 34 contains two types of analysis, critical dimension and pattern registration Analysis of pattern registration data is known to those skilled in the lithographic arts. The critical dimension analysis has two sub-programs, focus exposure and uniformity Uniformity analyzes the variations in process performance over different locations on a wafer. Focus exposure analyzes the relationship between focus, exposure and feature width. The data provided by a metrology tool is associated with the focus and exposure settings for a given experiment. Focus is indicated herein by a Z and represents the position setting of the semiconductor wafer plane relative to the image plane of the lithography tool. The actual focus at any given location and at any point in time during the process is affected by variations in both lithographic tool performance (repeatability and sensitivity of focus control) and process performance (topography, wafer flatness, thin film effects, etc.). Exposure is represented herein by E and identifies the shutter speed setting. The actual exposure corresponding to a feature size is determined by the ratio of the incident light energy to the photoresist threshold energy on the wafer. Exposure is affected by variations in both lithographic tool performance (lamp intensity, lamp uniformity, shutter speed, etc.) and process performance (film thickness, bake temperature, development rate, etc.). Critical dimension is represented by W and is a measure of the width of a line or other feature formed on an integrated circuit by the lithography process.

Figure 3:
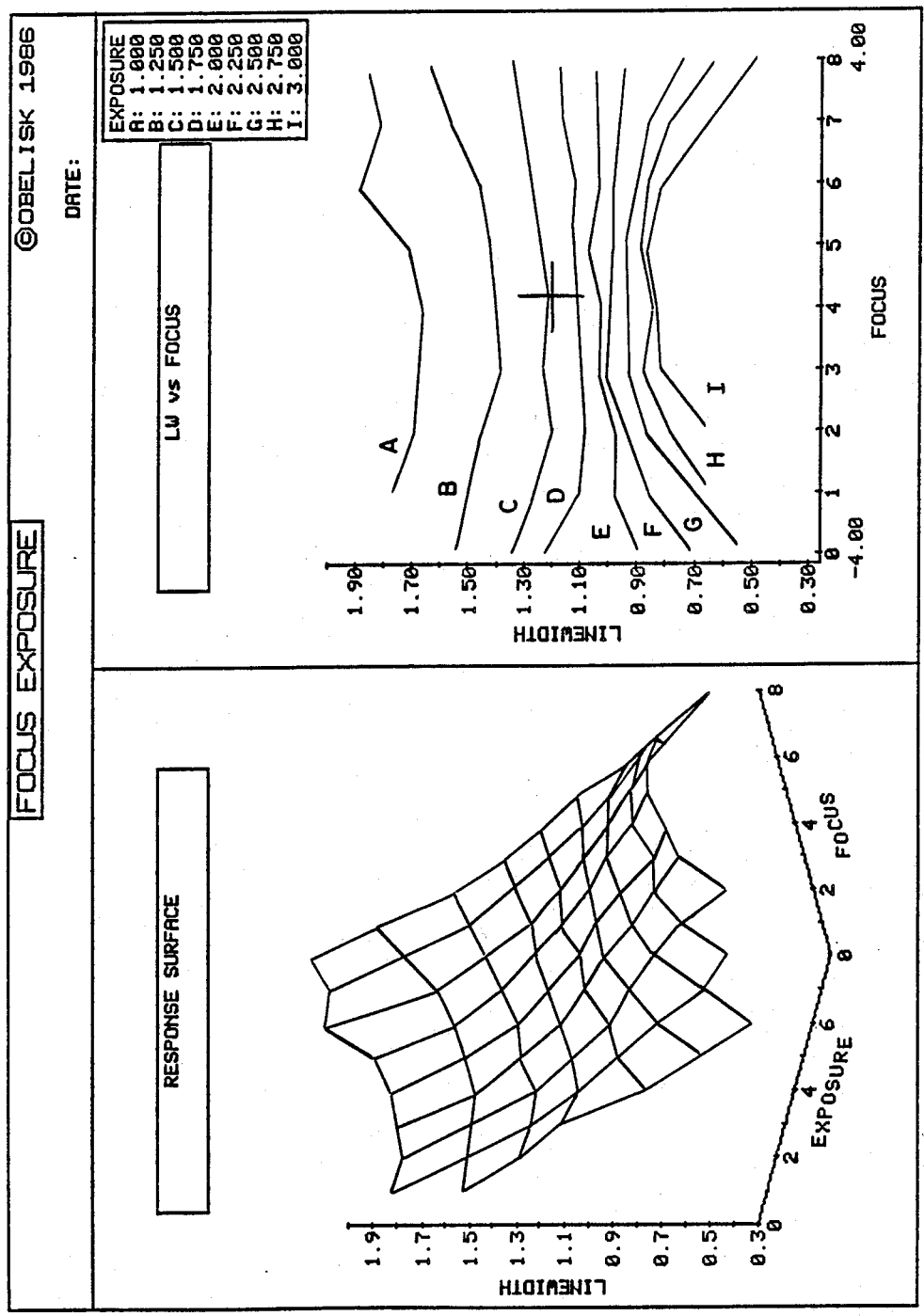
FIG. 3 is a monitor screen display produced by the system of the present invention.
Figure 4:
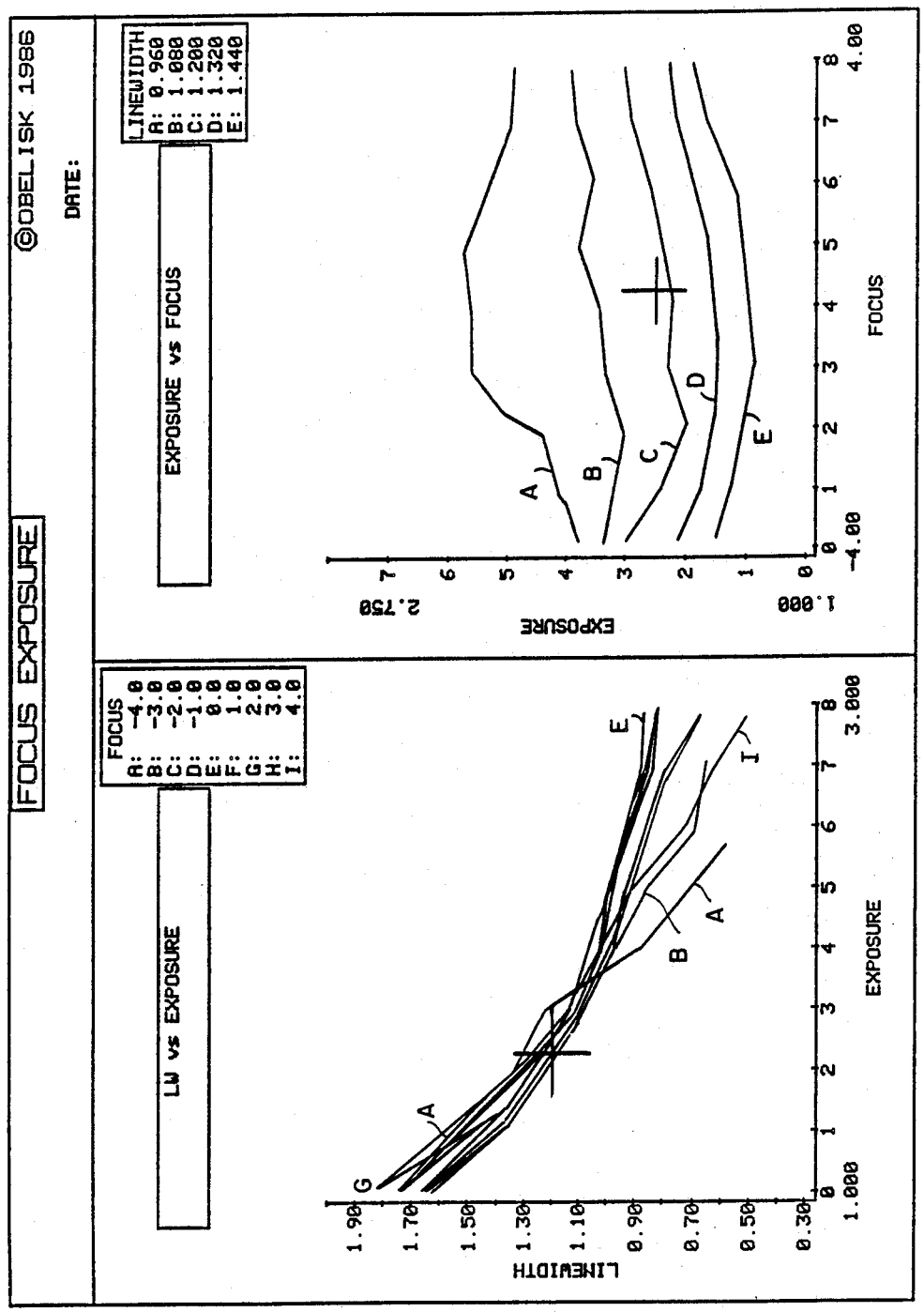
FIG. 4 is a monitor screen display produced by the system of the present invention.

The system of the present invention is capable of generating high resolution high speed two and three dimensional color graphics. Comparisons are made possible by independent right and left screen controls that permit simultaneous viewing of any two data sets including current, historic or modeled sets. Alternatively, the present control system has the ability to overlay 2 or more plots on one graph to provide immediate comparison. If the values of the parameters used differ for the two plots, the data in one of the plots can be interpolated so that the two plots are directly comparable. Furthermore, the system can change the range on a graph so that a graph can be expanded or contracted in any axis. Therefore, a graph can be made to zoom in on an area of interest The graphics and analysis capability of the present invention provides enhanced ability to make use of feature width, focus and exposure data. The control system of the present invention provides the data in the form of a graph for display on monitor 32 by the graphics display board of a computer. In examining focus exposure data sets, there are several different graphs which the present control system can produce. One of these is the response surface which is a three dimensional graph having the axes feature width (line width), exposure and focus. In FIG. 3, a measured response surface is shown on the left hand screen. The same data may be used to produce two dimensional graphs such as feature width versus focus, feature width versus exposure and exposure versus focus as shown in FIGS. 3 and 4. As can be seen in the graph of linewidth versus focus, linewidth is relatively insensitive to changes in focus. The optimum focus can be determined by picking the value where linewidth is most insensitive to exposure. In other words, where the curves on LW versus focus are most tightly bunched together or the curve in LW versus exposure having the smallest slope. Once given the optimum focus, one can call up the exposure versus focus graph and determine the optimum exposure on the plot corresponding to the desired linewidth. The range of acceptable exposure settings will be those found between the plots for the minimum an maximum acceptable linewidth An acceptable range of focus may be determined from the linewidth versus exposure graph on FIG. 4. The criterion for limiting the focus would be to permit only those focus settings which exhibit an acceptable ($\Delta W/\Delta E$), i.e., those in which the slope of the plots on the graph are minimal over the acceptable range of exposure. The display capability of the present invention is thus a great boon to the lithographic process engineer as it makes graphs useful for determining the optimal focus and exposure settings readily available.

Figure 5:
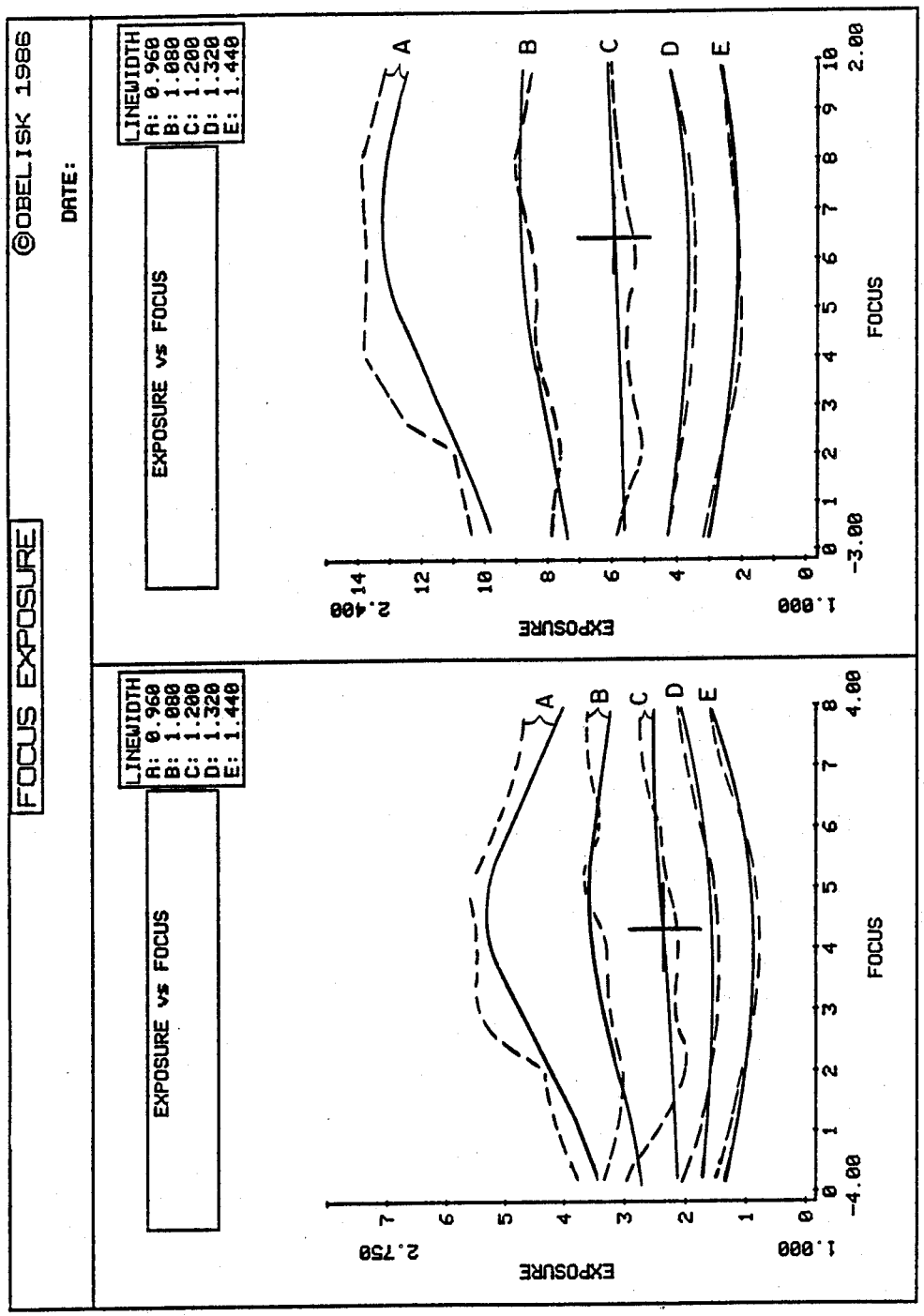
FIG. 5 is a monitor screen display of the present invention demonstrating the ability to expand the axis of a graph.

The control system of the present invention further provides the ability to best fit the measured focus-exposure linewidth data to a model set of equations. The resulting best fit model can be plotted and displayed as was done for the measured data. The system also has the ability to overlay plots on one graph. For example, FIG. 5 shows measured data in dashed lines overlaid upon its corresponding model in solid lines. Another graphic capability is demonstrated in FIG. 5. The graph in the left hand screen was expanded in the focus and exposure axes to produce the plots on the right hand screen.

Figure 6:
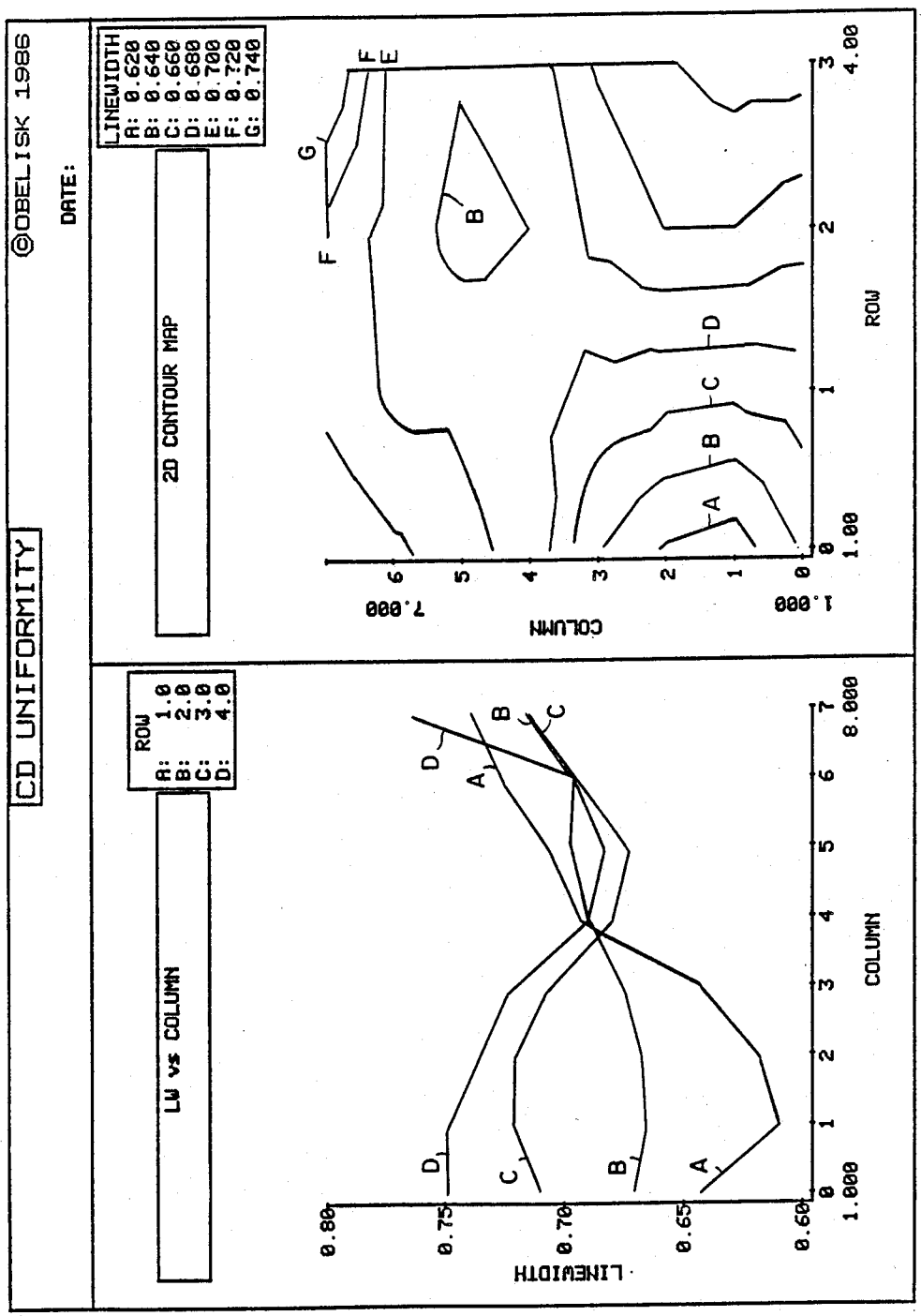
FIG. 6 is a monitor screen display produced by the system of the present invention.

Another concern of integrated circuit lithographers is the uniformity of the integrated circuit over the wafer. Therefore measurements are taken at various locations on the wafer so that the uniformity of the lithographic process over the wafer can be analyzed. These data sets which relate line width to location on the wafer may be represented by the present invention with a number of graphs including a response surface which is a three dimensional graph plotting line width against column and row. This data may also be provided in two dimensional graphs such as line width versus row, or line width versus column. Alternatively, a contour map can be drawn over the coordinate system of row versus column, as shown in FIG. 6.

Figure 7:
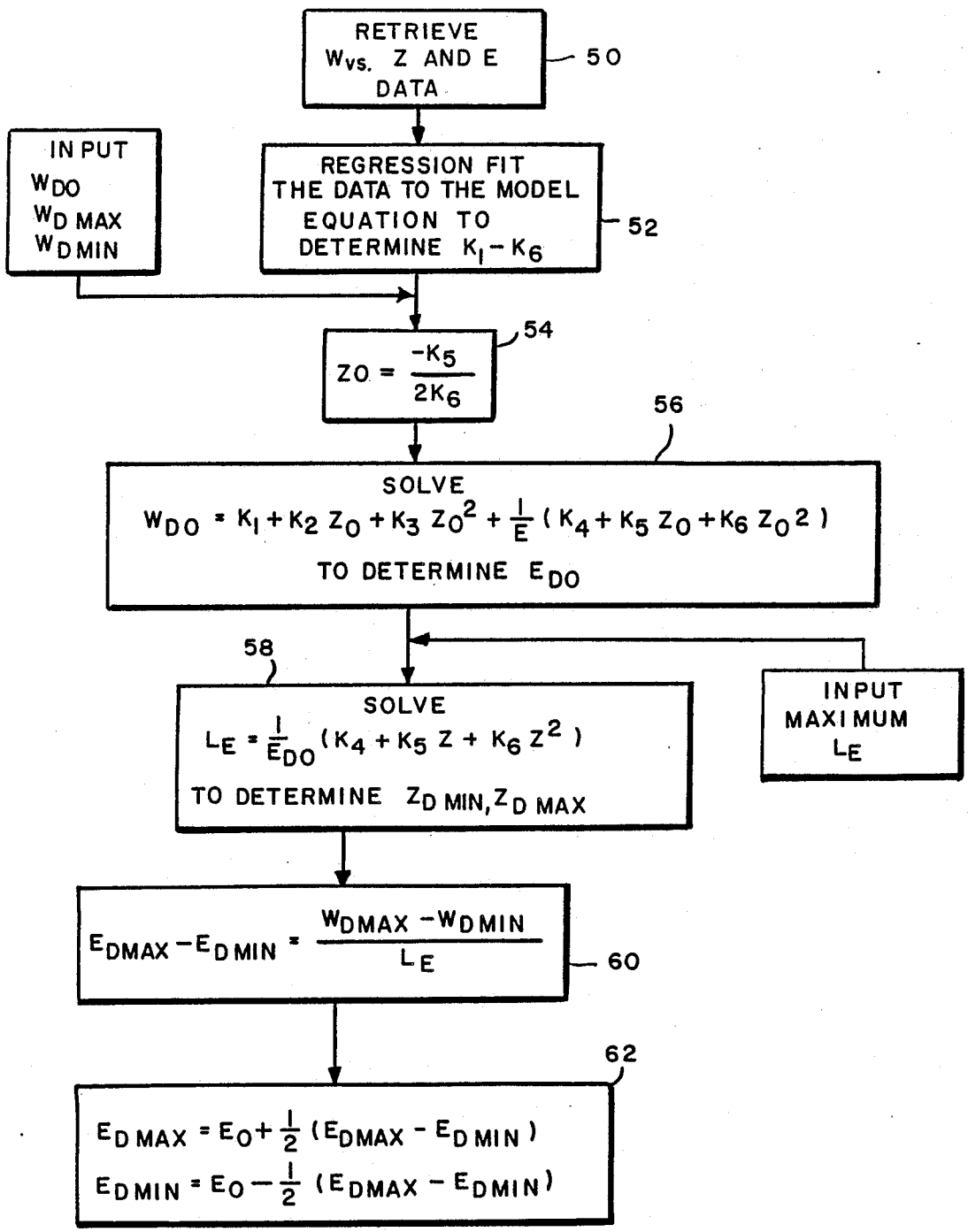
FIG. 7 is a flow chart of the CD engine of the present invention.

Referring now to FIG. 7, a flow chart of the CD engine of the controller 10 is shown. The CD engine best fits the data onto a model and determines a range for exposure and focus. The exact relationship between measured critical dimension (W) and focus E and exposure Z is extremely complex. In accordance with the present invention, the relationship between W and (E,Z) is approximated by a model that can be easily and rapidly determined by a computer The computation time is small enough such that the computer can determine the model and use it to perform real time control of a lithographic process.

The model is based on the following equation:

$$\frac{W}{W_O} = \frac{2}{\pi} \cos^{-1}\left[\frac{\pi}{4} \frac{1 - \frac{E_o}{E}}{1 - \frac{A}{W_o} - \frac{B}{W_o}(Z - Z_o)^2}\right] \quad (1)$$

Figure 8:
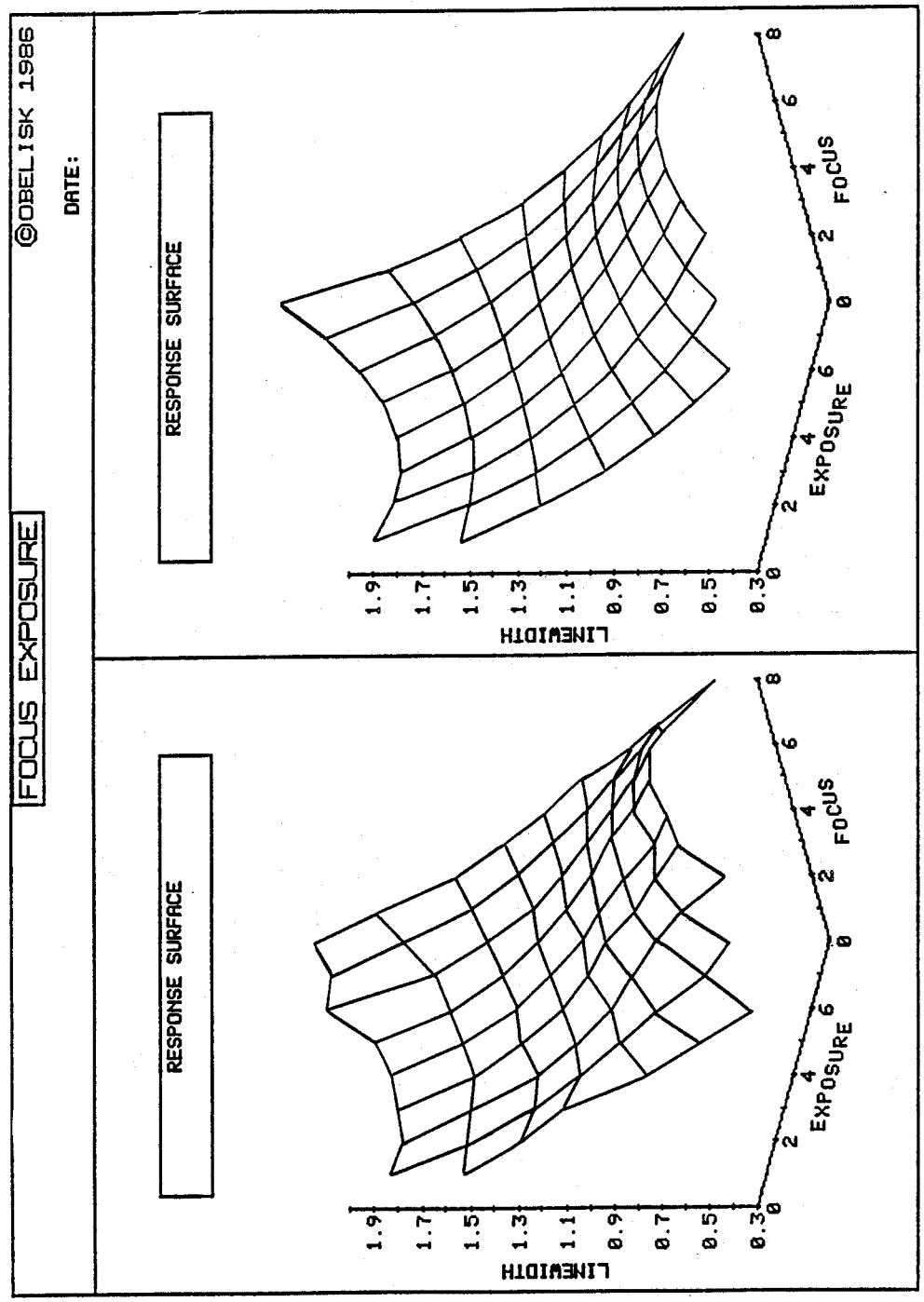
FIG. 8 is a monitor screen display produced by the system of the present invention.

In the equation, $W_O$ is the conjugate CD. That is the feature width at the isofocal point of the response surface. A typical modelled response surface is shown on the right hand side of a screen from the present invention shown in FIG. 8. The isofocal point is the location on the response surface where feature width W is least sensitive to changes in focus Z. $E_O$ and $Z_O$ represent the exposure and focus settings at the isofocal point.

$1-(A/W_O)$ is the effective image acuity at $Z=Z_O$. $(B/W_O)$ is the coefficient of image acuity degradation with defocus. The model is discussed in more detail in Ausschnitt, "Electrical Measurements for Characterizing Lithography", *VLSI Electronics: Microstructure Science*, vol. 16, Academic Press, Inc., 1987, p. 320–356, the disclosure of which is hereby incorporated by reference herein.

The present invention takes the above equation (1) and simplifies it based on the assumptions that W is approximately equal to $$W_0, \frac{A}{W_0} << 1 \text{ and } \frac{B}{W_0}(Z - Z_0)^2 << 1.$$

In this situation the equation can be approximated by $$W \simeq K_1 + K_2 Z + K_3 Z^2 + \frac{1}{E}(K_4 + K_5 Z + K_6 Z^2) \quad (2)$$

For equation (2), the physically meaningful parameters are related to the K coefficients by the following formulas:

$$W_o = K_1 - \frac{K_4 K_3}{K_6} \quad (3)$$

$$E_o = \frac{-K_6}{K_3} \quad (4)$$

$$Z_o = \frac{-K_5}{2K_6} \quad (5)$$

$$\frac{A}{W_o} = 2K_3\left(\frac{K_5}{2K_6}\right)^2 - K_1 - \frac{K_4 K_3}{K_6} \quad (6)$$

$$\frac{B}{W_o} = -2K_3 \quad (7)$$

$$\beta = \frac{K_2 K_6}{K_3 K_5} \quad (8)$$

The additional parameter $\beta$, describes the possible "tilt" or asymmetry in the dependence of feature width on focus variation about $Z_O$. The relationship of all the K's in the above equation to the control parameters E and Z is linear thus, the present invention can employ standard linear regression analysis to obtain the K values that provide best fit of the equation for the measured feature widths as a function of E and Z. Linear regression analysis can be accomplished rapidly on computers equipped with relatively inexpensive CPU's. Thus, the present invention can be used with economical apparatus and still be used for real time process control.

After having determined the model response surface the CD engine can use the best fit model to determine the range of parameters for E and Z which will accomplish a desired feature width tolerance. A system user inputs through the keyboard the desired feature width $W_{DO}$ along with the maximum $W_{DMAX}$ and minimum $W_{DMIN}$ acceptable feature widths.

Figure 9:
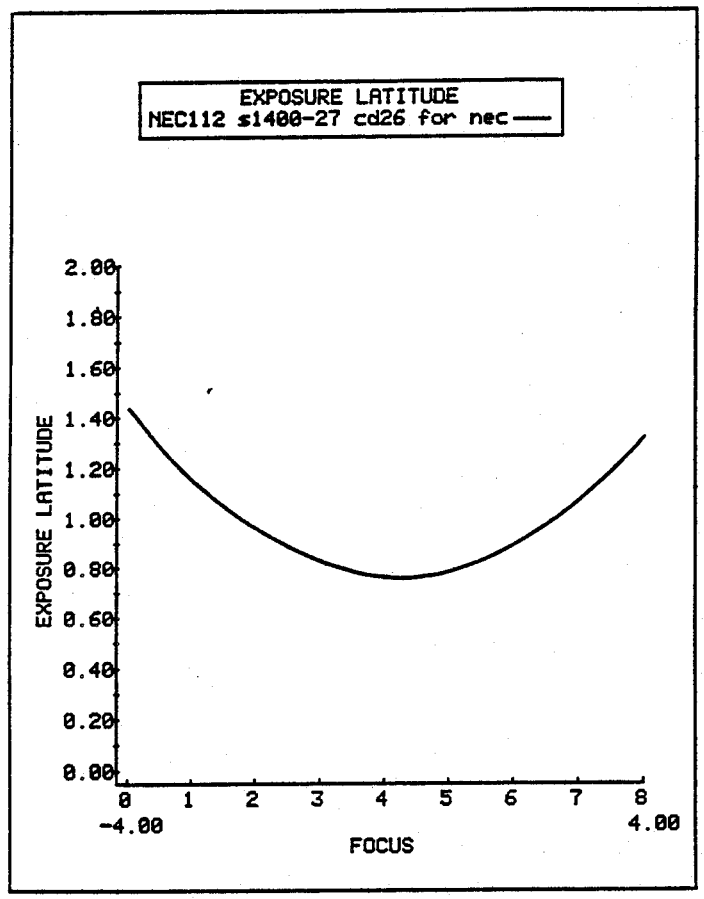
FIG. 9 is a plotted graph of exposure Latitude which can be displayed on the screen of the present invention.

The program takes $W_{DO}$, $W_{DMIN}$ and $W_{DMAX}$ and plugs them into the equation (2) to determine the relationship between focus and exposure for each. This relationship can be seen graphically in a display such as that shown in FIG. 5. $E_{DO}$ (optimum exposure setting) is determined by taking the value of E in equation (2)

for $W=W_{DO}$ and $Z=Z_O$. $Z_O$ is by definition the optimum focus and is given by equation (5). Exposure latitude $L_E$ is the rate at which feature width W changes with exposure E. Thus, it equals the derivative of the curve which plots feature width against exposure. This can be easily computed for the model curves and a sample exposure latitude plot is shown in FIG. 9. An equation defining exposure latitude at a particular exposure setting $E_D$ $$L_E = \left| E \frac{dW}{dE} \right|_{ED} = \frac{1}{ED} (K_4 + K_5 Z + K_6 Z^2)$$

The minimum exposure latitude corresponds to the process which is least sensitive to exposure variations. For a given process, limits are set on exposure latitude to provide limits on process stability and thus set a desired process quality. Alternatively, instead of exposure latitude, the sidewall angle made by the photoresist material with the wafer may be used as a criterion for the process quality. The relationship between sidewall angle $\theta$ and exposure latitude $L_E$ is given by:

$$\tan\theta \alpha \frac{2t_o}{L_E}$$

where $t_O$ is the thickness of the photoresist film prior to exposure. A system user inputs into the computer, the maximum exposure latitude $L_E$ or the corresponding minimum sidewall angle. The computer, knowing the K's from the best fit equation, calculates $Z_{Dmin}$ and $Z_{Dmax}$ from the following equation as a function of maximum exposure latitude.

$$L_E \Big|_{ED=EDO} = \frac{1}{E90} (K_4 + K_5 Z + K_6 Z^2) = L_{EMAX}$$

$Z_{DMIN}$ and $Z_{DMAX}$ are the roots of this quadratic equation. Referring to the exposure latitude plot in FIG. 9 when a maximum exposure latitude is applied to the exposure latitude curve the minimum and maximum focus values are immediately apparent.

The minimum and maximum exposures are determined by taking the allowable range of feature width ($W_{DMAX} - W_{DMIN}$) and dividing by the maximum exposure latitude input by the user. This gives the allowable range for exposure $E_{DMAX} - E_{DMIN}$. In the normal case, $E_{DMAX} = E_O + \frac{1}{2}(E_{DMAX} - E_{DMIN})$ and $E_{DMIN} = E_O - \frac{1}{2}(E_{DMAX} - E_{DMIN})$. The range of exposures and focus settings are referred to as a largest available window (LAW). The LAW defines the desired operating range of the lithography equipment to provide the desired process quality and restrict feature widths to within the stated tolerance.

The ability to determine a largest available window for the focus and exposure settings to achieve a desired feature width may be used in a number of ways. One of these ways is to determine the optimum process for obtaining the desired feature width. A number of different data sets are generated by running different processes wherein for each process some variable has been changed such as bake temperature, development rate, film thickness, photoresist, lithographic tool, etc. For each process the CD engine determines the largest available window and these windows are compared to determine the process that provides the maximum window. This will give the process which will be expected to most reliably provide the desired feature width in manufacturing The CD engine may also be used to analyze the spatial variation and feature widths caused by a particular process. Feature width measurements are made for a process at a number of different locations during an experimental run. The data sets provided at each location are used to determine the largest available window of exposure and focus settings as determined by the results for each location. The largest available exposure focus windows for each of the locations are compared and the portion of the windows which overlap is given as the net largest available window for a particular process.

In accordance with the present invention, the CD engine can advantageously be used to control a process in real time. Since critical dimension or line width is relatively insensitive to focus variation at or near the desired line width only exposure needs to be controlled in real time. Focus may be checked periodically, for example once a day, and corrected to maintain the process running within the desired parameters.

In order to check the focus, the manufacturing process is interrupted for a trial run in which exposure and focus are varied to produce enough data to form a response surface. The measurements are taken at one or more selected locations. It is preferred that the locations be those which had the greatest input on the net largest available window for the process.

Steps 50, 52 and 54 of the CD engine of FIG. 7 are applied to the data to obtain $Z_O$ for each location. Each location has a characteristic offset equal to the difference between $Z_O$ for the net largest available window and $Z_O$ for the LAW at the particular location If the response of the process is constant the $Z_O$ for each of the locations will result in a single $Z_O$ for the net LAW when the offsets are added in. If the response has changed, the offsets may be scaled to produce a single $Z_O$. If the changes exceed predetermined limits then the process shall be checked to locate and remove the source of instability. Occasionally the entire process will need to be recharacterized. If $Z_O$ has been changed, the net LAW is shifted so as to be centered about the new $Z_O$ and the lithography tool is now set at the new $Z_O$.

Figure 10:
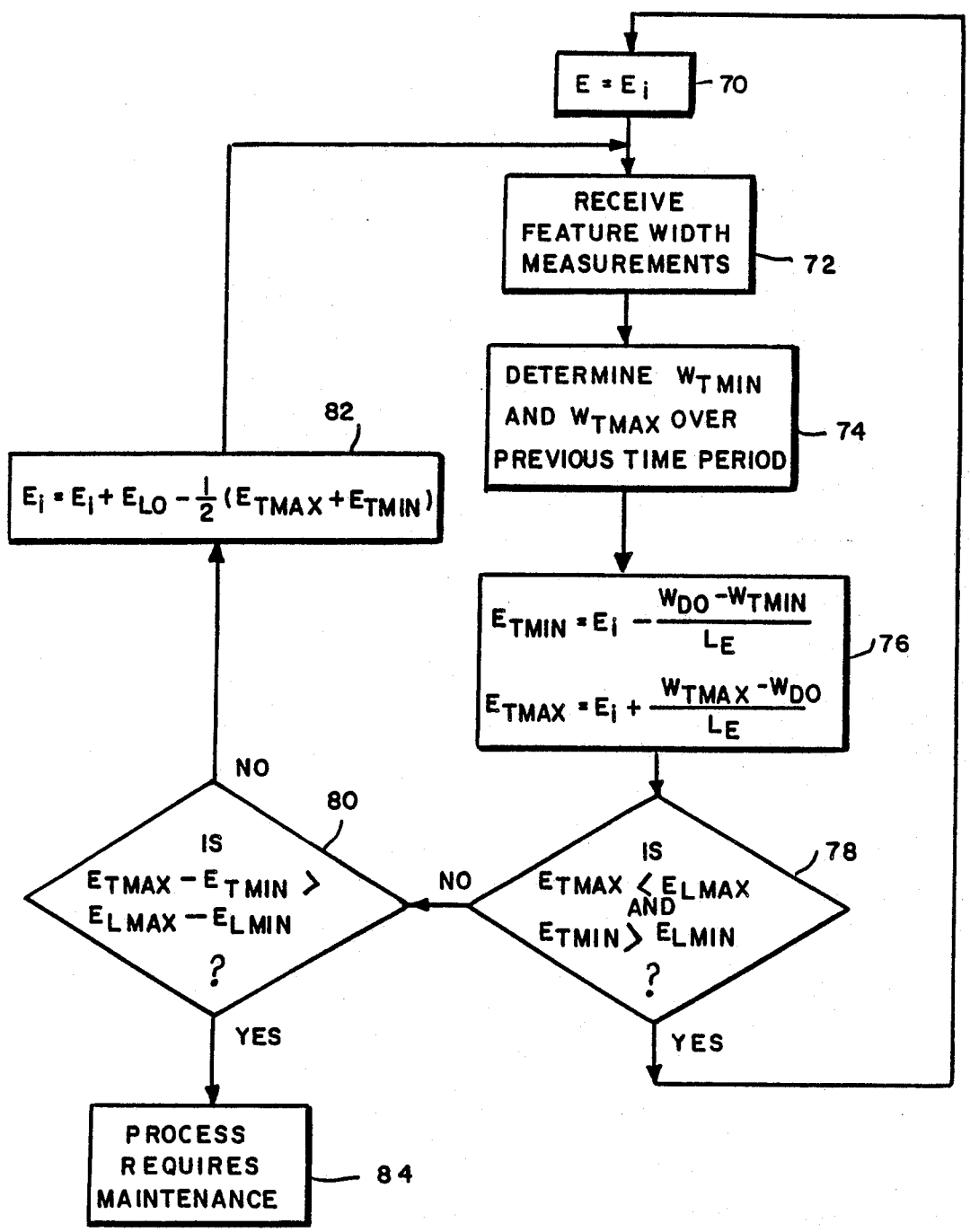
FIG. 10 is a flow chart of the real time exposure control of the present invention.

Referring now to FIG. 10, Exposure can be controlled by the present invention in real time as the manufacturing process is in progress. The starting exposure setting $E_i$ is stored. Measurements of feature width are accumulated for one or more locations over a given time period. The time period used should depend upon the stability of the process, a more stable process could use a longer time period. The minimum and maximum feature widths produced in the time period are identified. The exposure variations for each location are determined from the variation between the maximum width and the minimum width divided by the predetermined exposure latitude of the system at the location and at the operating focus. These can be represented by the following equations:

$$E_{Tmin} = E_I - \left| \frac{W_{Do} - W_{Tmin}}{L_E} \right|$$

$$E_{Tmax} = E_I - \left| \frac{W_{Tmax} - W_{Do}}{L_E} \right|$$

If the extremes of the exposure are within the net largest available window then no correction need be made. However, the system could be arranged to send a correction signal whenever the midpoint between the extremes of exposure shift away from the optimum exposure by more than a predetermined threshold. If one of the exposure extremes is outside of the LAW, then the action depends on whether the span between the extremes is greater than the span between the exposure limits of the LAW. If the extremes of the exposure have a smaller span than that for the LAW, then a new exposure setting is determined from the equation $E_i = E_i + E_{LO} - \frac{1}{2}(E_{TMAX} + E_{TMIN})$ where $E_{LO}$ is the optimum exposure in the LAW. Thus, a control signal is sent to the lithography tool to shift the exposure setting an amount equal and opposite to the detected shift. If the extremes of the exposure unacceptably vary by more than the variation exposure limits of the net LAW then the process needs to be checked to diagnose the source of the instability. It is possible that the process will need to be recharacterized.

While a specific implementation of the lithography analysis and control system is disclosed above for the presently preferred embodiment of the invention, the invention is not limited thereto. Modifications thereof within the spirit and scope of the invention will occur to those in the art. It is therefore intended that such modifications be covered by the following claims.

I claim:

1. A lithographic process analysis system comprising:
   memory means for storing feature width, exposure and focus data;
   means for receiving feature width, exposure and focus data and for supplying said data to said memory means;
   processor means for determining the best fit of said data on a critical dimension model to identify a best fit model;
   means for displaying said best fit model of said data on a three dimensional graph whose axes are feature width, exposure and focus.

2. The lithographic process analysis system of claim 1 wherein said critical dimension model comprises the following equation:

$$W = K_1 + K_2 Z + K_3 Z^2 + \frac{1}{E}(K_4 + K_5 Z + K_6 Z^2)$$

3. The lithographic process analysis system of claim 1 wherein said processor means includes means for performing linear regression analysis.

4. The lithographic process analysis system of claim 1 wherein said displaying means further includes means for displaying a three dimensional graph whose axes are measured feature width, measured exposure and measured focus alongside said graph of said best fit model.

5. The lithographic process analysis system of claim I wherein said displaying means further includes means for displaying a three dimensional graph of the measured data in feature width, focus and exposure overlaid on the three dimensional graph of the best fit model.

6. The lithographic process analysis system of claim 1 wherein said processor means further includes means for determining a range of focus from a predetermined maximum exposure latitude.

7. The lithographic process analysis system of claim 1 wherein said processor means further includes means for determining a range of focus from a predetermined minimum sidewall angle.

8. The lithographic process analysis system of claim 1 wherein said displaying means further includes means for displaying a two dimensional graph in any of the two dimensions used in said three dimensional graph.

9. The lithographic process analysis system of claim 1 wherein said displaying means further includes means for displaying a two dimensional graph overlaid on a three dimensional graph.

10. A lithographic analysis and control system comprising:
    processor means for determining a largest available window in focus and exposure by best fitting experimental focus, exposure and feature width data into a critical dimension model, said model including an equation defining exposure latitude;
    means for receiving feature width measurements from the lithographic process being controlled;
    said processor means further including means for identifying a shift in exposure from said feature width measurements and said exposure latitude equation, and means, responsive to said identifying means, for generating a correction signal; and
    an interface for transmitting said correction signal to a tool to correct the shift in exposure.

11. A method for controlling a lithographic process comprising:
    determining an optimal exposure setting and a largest available window in focus and exposure by best fitting experimental focus, exposure and feature width data onto a critical dimension model, said model including an equation defining exposure latitude;
    receiving feature width measurements from the lithographic process being controlled;
    determining the minimum and maximum feature widths received over a period of time;
    determining maximum and minimum effective exposures from said minimum and maximum feature widths and said exposure latitude equation;
    providing a correction signal to a lithographic tool to correct for a shift in the midpoint between maximum and minimum exposure away from said optimal exposure setting.

12. The method of claim 11 wherein said step of determining an optimal exposure setting and a largest available window includes the steps of:
    measuring feature width as a function of focus and exposure;
    best fitting the measurements of feature width, focus and exposure to a critical dimension model which inherently provides an optimum focus;
    determining the value of optimal exposure in the critical dimension model when focus equals the optimum focus and feature width equals a predetermined desired width;
    determining a range of focus by setting exposure latitude at the optimal exposure to a selected maximum;
    determining a range of exposure by dividing a predetermined range of feature width by said selected maximum exposure latitude.

* * * * *